United States Patent
Zhang et al.

(10) Patent No.: US 8,330,244 B2
(45) Date of Patent: *Dec. 11, 2012

(54) SEMICONDUCTOR DEVICES INCLUDING SCHOTTKY DIODES HAVING DOPED REGIONS ARRANGED AS ISLANDS AND METHODS OF FABRICATING SAME

(75) Inventors: Qingchun Zhang, Cary, NC (US);
Sei-Hyung Ryu, Raleigh, NC (US);
Anant Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/492,670

(22) Filed: Jun. 26, 2009

(65) Prior Publication Data
US 2009/0315036 A1 Dec. 24, 2009

Related U.S. Application Data

(63) Continuation of application No. 11/496,842, filed on Aug. 1, 2006, now Pat. No. 7,728,402.

(51) Int. Cl.
*H01L 27/095* (2006.01)
*H01L 29/47* (2006.01)
*H01L 29/812* (2006.01)
*H01L 31/07* (2006.01)

(52) U.S. Cl. ............. 257/471; 257/484; 257/E27.04; 257/E29.338

(58) Field of Classification Search .......... 257/104, 257/106, 112, 155, 260, 267, 471, 472, 474, 257/484, 928, E27.04, E29.338, E31.065, 257/E31.066
See application file for complete search history.

(56) References Cited

U.S. PATENT DOCUMENTS

| | | | |
|---|---|---|---|
| 3,439,189 A | 4/1969 | Petry | |
| 3,629,011 A | 12/1971 | Tohi et al. | |
| 3,924,024 A | 12/1975 | Naber et al. | |
| 4,160,920 A | 7/1979 | Courier de Mere | |
| 4,242,690 A | 12/1980 | Temple | |
| 4,466,172 A | 8/1984 | Batra | |

(Continued)

FOREIGN PATENT DOCUMENTS

DE 39 42 640 A1 8/1990

(Continued)

OTHER PUBLICATIONS

"Insulated-gate bipolar transistor." *Wikipedia, The Free Encyclopedia.* Web. Jun. 21, 2010. http://en.wikipedia.org.

(Continued)

*Primary Examiner* — Hoai V Pham
(74) *Attorney, Agent, or Firm* — Myers Bigel Sibley & Sajovec

(57) ABSTRACT

A semiconductor device according to some embodiments includes a semiconductor layer having a first conductivity type and a surface in which an active region of the semiconductor device is defined. A plurality of spaced apart first doped regions are arranged within the active region. The plurality of first doped regions have a second conductivity type that is opposite the first conductivity type, have a first dopant concentration, and define a plurality of exposed portions of the semiconductor layer within the active region. The plurality of first doped regions are arranged as islands in the semiconductor layer. A second doped region in the semiconductor layer has the second conductivity type and has a second dopant concentration that is greater than the first dopant concentration.

20 Claims, 6 Drawing Sheets

U.S. PATENT DOCUMENTS

| | | | |
|---|---|---|---|
| 4,581,542 A | 4/1986 | Steigerwald | |
| 4,644,637 A | 2/1987 | Temple | |
| 4,811,065 A | 3/1989 | Cogan | |
| 4,875,083 A | 10/1989 | Palmour | |
| 4,927,772 A | 5/1990 | Arthur et al. | |
| 4,945,394 A | 7/1990 | Palmour et al. | |
| 4,946,547 A | 8/1990 | Palmour et al. | |
| 5,011,549 A | 4/1991 | Kong et al. | |
| 5,028,977 A | 7/1991 | Kenneth et al. | |
| 5,032,888 A | 7/1991 | Seki | |
| 5,111,253 A | 5/1992 | Korman et al. | |
| 5,155,289 A | 10/1992 | Bowles | |
| 5,170,231 A | 12/1992 | Fujii et al. | |
| 5,170,455 A | 12/1992 | Goossen et al. | |
| 5,184,199 A | 2/1993 | Fujii et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,270,554 A | 12/1993 | Palmour | |
| 5,291,050 A | 3/1994 | Nishimura | |
| 5,292,501 A | 3/1994 | Degenhardt et al. | |
| 5,296,395 A | 3/1994 | Khan et al. | |
| 5,348,895 A | 9/1994 | Smayling et al. | |
| 5,371,383 A | 12/1994 | Miyata et al. | |
| 5,384,270 A | 1/1995 | Ueno | |
| 5,385,855 A | 1/1995 | Brown et al. | |
| RE34,861 E | 2/1995 | Davis et al. | |
| 5,393,993 A | 2/1995 | Edmond et al. | |
| 5,393,999 A | 2/1995 | Malhi | |
| 5,396,085 A | 3/1995 | Baliga | |
| 5,399,887 A | 3/1995 | Weitzel et al. | |
| 5,459,107 A | 10/1995 | Palmour | |
| 5,468,654 A | 11/1995 | Harada | |
| 5,473,176 A | 12/1995 | Kakumoto | |
| 5,479,316 A | 12/1995 | Smrtic et al. | |
| 5,488,236 A | 1/1996 | Baliga et al. | |
| 5,506,421 A | 4/1996 | Palmour | |
| 5,510,281 A | 4/1996 | Ghezzo et al. | |
| 5,510,630 A | 4/1996 | Agarwal | |
| 5,523,589 A | 6/1996 | Edmond et al. | |
| 5,539,217 A | 7/1996 | Edmond et al. | |
| 5,545,905 A | 8/1996 | Muraoka et al. | |
| 5,587,870 A | 12/1996 | Anderson et al. | |
| 5,629,531 A | 5/1997 | Palmour | |
| 5,710,059 A | 1/1998 | Rottner | |
| 5,726,463 A | 3/1998 | Brown et al. | |
| 5,726,469 A | 3/1998 | Chen | |
| 5,734,180 A | 3/1998 | Malhi | |
| 5,739,564 A | 4/1998 | Kosa et al. | |
| 5,763,905 A | 6/1998 | Harris | |
| 5,776,837 A | 7/1998 | Palmour | |
| 5,804,483 A | 9/1998 | Harris | |
| 5,814,859 A | 9/1998 | Ghezzo et al. | |
| 5,831,288 A | 11/1998 | Singh et al. | |
| 5,837,572 A | 11/1998 | Gardner et al. | |
| 5,851,908 A | 12/1998 | Harris et al. | |
| 5,877,041 A | 3/1999 | Fuller | |
| 5,877,045 A | 3/1999 | Kapoor | |
| 5,885,870 A | 3/1999 | Maiti et al. | |
| 5,914,500 A | 6/1999 | Bakowski et al. | |
| 5,917,203 A | 6/1999 | Bhatnagar et al. | |
| 5,939,763 A | 8/1999 | Hao et al. | |
| 5,960,289 A | 9/1999 | Tsui et al. | |
| 5,969,378 A | 10/1999 | Singh | |
| 5,972,801 A | 10/1999 | Lipkin et al. | |
| 5,976,936 A | 11/1999 | Miyajima et al. | |
| 5,977,605 A | 11/1999 | Bakowsky et al. | |
| 6,020,600 A | 2/2000 | Miyajima et al. | |
| 6,025,233 A | 2/2000 | Terasawa | |
| 6,025,608 A | 2/2000 | Harris et al. | |
| 6,028,012 A | 2/2000 | Wang | |
| 6,040,237 A | 3/2000 | Bakowski et al. | |
| 6,048,766 A | 4/2000 | Gardner et al. | |
| 6,054,352 A | 4/2000 | Ueno | |
| 6,054,728 A | 4/2000 | Harada et al. | |
| 6,063,698 A | 5/2000 | Tseng et al. | |
| 6,083,814 A | 7/2000 | Nilsson | |
| 6,096,607 A | 8/2000 | Ueno | |
| 6,100,169 A | 8/2000 | Suvorov et al. | |
| 6,104,043 A | 8/2000 | Hermansson et al. | |
| 6,107,142 A | 8/2000 | Suvorov et al. | |
| 6,117,735 A | 9/2000 | Ueno | |
| 6,121,633 A | 9/2000 | Singh et al. | |
| 6,133,587 A | 10/2000 | Takeuchi et al. | |
| 6,136,727 A | 10/2000 | Ueno | |
| 6,136,728 A | 10/2000 | Wang | |
| 6,165,822 A | 12/2000 | Okuno et al. | |
| 6,180,958 B1 | 1/2001 | Cooper, Jr. | |
| 6,190,973 B1 | 2/2001 | Berg et al. | |
| 6,204,135 B1 | 3/2001 | Peters et al. | |
| 6,204,203 B1 | 3/2001 | Narwankar et al. | |
| 6,211,035 B1 | 4/2001 | Moise et al. | |
| 6,218,254 B1 | 4/2001 | Singh et al. | |
| 6,218,680 B1 | 4/2001 | Carter, Jr. et al. | |
| 6,221,688 B1 * | 4/2001 | Fujihira et al. | 438/92 |
| 6,221,700 B1 | 4/2001 | Okuno et al. | |
| 6,228,720 B1 | 5/2001 | Kitabatake et al. | |
| 6,238,967 B1 | 5/2001 | Shiho et al. | |
| 6,239,463 B1 | 5/2001 | Williams et al. | |
| 6,239,466 B1 | 5/2001 | Elasser et al. | |
| 6,246,076 B1 | 6/2001 | Lipkin et al. | |
| 6,297,100 B1 | 10/2001 | Kumar et al. | |
| 6,297,172 B1 | 10/2001 | Kashiwagi | |
| 6,303,508 B1 | 10/2001 | Alok | |
| 6,316,791 B1 | 11/2001 | Schorner et al. | |
| 6,316,793 B1 | 11/2001 | Sheppard et al. | |
| 6,329,675 B2 | 12/2001 | Singh et al. | |
| 6,344,663 B1 | 2/2002 | Slater, Jr. et al. | |
| 6,365,932 B1 | 4/2002 | Kouno et al. | |
| 6,388,271 B1 | 5/2002 | Mitlehner et al. | |
| 6,399,996 B1 | 6/2002 | Chang et al. | |
| 6,420,225 B1 | 7/2002 | Chang et al. | |
| 6,429,041 B1 | 8/2002 | Ryu et al. | |
| 6,448,160 B1 | 9/2002 | Chang et al. | |
| 6,455,892 B1 | 9/2002 | Okuno et al. | |
| 6,475,889 B1 | 11/2002 | Ring | |
| 6,515,303 B2 | 2/2003 | Ring | |
| 6,524,900 B2 | 2/2003 | Dahlqvist et al. | |
| 6,548,333 B2 | 4/2003 | Smith | |
| 6,551,865 B2 | 4/2003 | Kumar et al. | |
| 6,573,534 B1 | 6/2003 | Kumar et al. | |
| 6,593,620 B1 | 7/2003 | Hshieh et al. | |
| 6,610,366 B2 | 8/2003 | Lipkin | |
| 6,627,539 B1 | 9/2003 | Zhao et al. | |
| 6,649,497 B2 | 11/2003 | Ring | |
| 6,653,659 B2 | 11/2003 | Ryu et al. | |
| 6,696,705 B1 | 2/2004 | Barthelmess et al. | |
| 6,703,642 B1 | 3/2004 | Shah | |
| 6,743,703 B2 | 6/2004 | Rodov et al. | |
| 6,767,843 B2 | 7/2004 | Lipkin et al. | |
| 6,861,723 B2 | 3/2005 | Willmeroth | |
| 6,936,850 B2 | 8/2005 | Friedrichs et al. | |
| 6,946,739 B2 | 9/2005 | Ring | |
| 6,956,238 B2 | 10/2005 | Ryu et al. | |
| 6,979,863 B2 | 12/2005 | Ryu | |
| 7,026,650 B2 | 4/2006 | Ryu et al. | |
| 7,074,643 B2 | 7/2006 | Ryu | |
| 7,118,970 B2 | 10/2006 | Das et al. | |
| 7,125,786 B2 | 10/2006 | Ring et al. | |
| 7,183,575 B2 | 2/2007 | Shimoida et al. | |
| 7,221,010 B2 | 5/2007 | Ryu | |
| 7,247,550 B2 | 7/2007 | Zhang | |
| 7,253,031 B2 | 8/2007 | Takahashi et al. | |
| 7,279,115 B1 | 10/2007 | Sumakeris | |
| 7,304,363 B1 | 12/2007 | Shah | |
| 7,365,363 B2 | 4/2008 | Kojima et al. | |
| 7,381,992 B2 | 6/2008 | Ryu | |
| 7,528,040 B2 | 5/2009 | Das et al. | |
| 7,544,963 B2 | 6/2009 | Saxler | |
| 7,548,112 B2 | 6/2009 | Sheppard | |
| 7,649,213 B2 | 1/2010 | Hatakeyama et al. | |
| 7,687,825 B2 | 3/2010 | Zhang | |
| 7,728,402 B2 | 6/2010 | Zhang et al. | |
| 2001/0055852 A1 | 12/2001 | Moise et al. | |
| 2002/0030191 A1 | 3/2002 | Das et al. | |
| 2002/0038891 A1 | 4/2002 | Ryu et al. | |
| 2002/0047125 A1 | 4/2002 | Fukuda et al. | |

| | | | | | | |
|---|---|---|---|---|---|---|
| 2002/0072247 | A1 | 6/2002 | Lipkin et al. | EP | 1 460 681 A2 | 9/2004 |
| 2002/0102358 | A1 | 8/2002 | Das et al. | EP | 1 503 425 A2 | 2/2005 |
| 2002/0121641 | A1 | 9/2002 | Alok et al. | EP | 1 693 896 A1 | 8/2006 |
| 2002/0125482 | A1* | 9/2002 | Friedrichs et al. ............ 257/73 | EP | 1 806 787 A1 | 7/2007 |
| 2002/0125541 | A1 | 9/2002 | Korec et al. | EP | 1 845 561 A2 | 10/2007 |
| 2003/0025175 | A1 | 2/2003 | Asano et al. | EP | 2 015 364 | 1/2009 |
| 2003/0107041 | A1 | 6/2003 | Tanimoto et al. | JP | 60-240158 | 11/1985 |
| 2003/0137010 | A1 | 7/2003 | Friedrichs et al. | JP | 01117363 | 5/1989 |
| 2003/0178672 | A1 | 9/2003 | Hatakeyama et al. | JP | 3 034466 A | 2/1991 |
| 2003/0201455 | A1 | 10/2003 | Takahashi et al. | JP | 03034466 | 2/1991 |
| 2004/0016929 | A1 | 1/2004 | Nakatsuka et al. | JP | 03157974 | 7/1991 |
| 2004/0079989 | A1 | 4/2004 | Kaneko et al. | JP | 3-225870 | 10/1991 |
| 2004/0082116 | A1 | 4/2004 | Kub et al. | JP | 5 029628 A | 2/1993 |
| 2004/0183079 | A1 | 9/2004 | Kaneko et al. | JP | 7066433 A | 3/1995 |
| 2004/0211980 | A1 | 10/2004 | Ryu | JP | 2006-511961 A | 4/1996 |
| 2004/0212011 | A1 | 10/2004 | Ryu | JP | 08264766 | 10/1996 |
| 2004/0256659 | A1 | 12/2004 | Kim et al. | JP | 9 129874 A | 5/1997 |
| 2004/0259339 | A1 | 12/2004 | Tanabe et al. | JP | 09205202 | 8/1997 |
| 2005/0012143 | A1 | 1/2005 | Tanaka et al. | JP | 9 326486 A | 12/1997 |
| 2005/0104072 | A1 | 5/2005 | Slater, Jr. et al. | JP | 11191559 | 7/1999 |
| 2005/0139936 | A1 | 6/2005 | Li | JP | 11238742 A | 8/1999 |
| 2005/0151138 | A1 | 7/2005 | Slater, Jr. et al. | JP | 11261061 A | 9/1999 |
| 2005/0181536 | A1 | 8/2005 | Tsuji | JP | 11266017 A | 9/1999 |
| 2005/0224838 | A1 | 10/2005 | Tanaka et al. | JP | 11274487 | 10/1999 |
| 2005/0245034 | A1 | 11/2005 | Fukuda et al. | JP | 2000049167 | 2/2000 |
| 2005/0275055 | A1 | 12/2005 | Parthasarathy et al. | JP | 2000077682 A | 3/2000 |
| 2006/0011128 | A1 | 1/2006 | Ellison et al. | JP | 2000082812 A | 3/2000 |
| 2006/0060884 | A1 | 3/2006 | Ohyanagi et al. | JP | 2000-252478 A | 9/2000 |
| 2006/0086997 | A1 | 4/2006 | Kanaya et al. | JP | 02000252461 A | 9/2000 |
| 2006/0118818 | A1 | 6/2006 | Shimoida et al. | JP | 2000252478 A | 9/2000 |
| 2006/0211210 | A1 | 9/2006 | Bhat et al. | JP | 2001-085704 A | 3/2001 |
| 2006/0244010 | A1 | 11/2006 | Saxler | JP | 2000106371 A | 4/2001 |
| 2006/0255423 | A1 | 11/2006 | Ryu et al. | JP | 2002-314099 | 10/2002 |
| 2006/0261347 | A1 | 11/2006 | Ryu et al. | JP | 2005-167035 A | 6/2005 |
| 2006/0261876 | A1 | 11/2006 | Agarwal et al. | WO | WO 96/03774 | 2/1996 |
| 2006/0267021 | A1 | 11/2006 | Rowland et al. | WO | WO 97/08754 | 3/1997 |
| 2007/0066039 | A1 | 3/2007 | Agarwal et al. | WO | WO 97/17730 | 5/1997 |
| 2007/0120148 | A1 | 5/2007 | Nogome | WO | WO 97/39485 A1 | 10/1997 |
| 2007/0164321 | A1 | 7/2007 | Sheppard et al. | WO | WO 98/02916 | 1/1998 |
| 2007/0241427 | A1 | 10/2007 | Mochizuki et al. | WO | WO 98/02924 A2 | 1/1998 |
| 2008/0001158 | A1 | 1/2008 | Das et al. | WO | WO 98/08259 | 2/1998 |
| 2008/0006848 | A1 | 1/2008 | Chen et al. | WO | WO 98/32178 | 7/1998 |
| 2008/0029838 | A1 | 2/2008 | Zhang et al. | WO | WO 99/46809 A1 | 9/1999 |
| 2008/0105949 | A1 | 5/2008 | Zhang et al. | WO | WO99/63591 A1 | 12/1999 |
| 2008/0121993 | A1 | 5/2008 | Hefner et al. | WO | WO 00/13236 A3 | 3/2000 |
| 2008/0191304 | A1 | 8/2008 | Zhang et al. | WO | WO 01/78134 A1 | 10/2001 |
| 2008/0230787 | A1 | 9/2008 | Suzuki et al. | WO | WO 2004/020706 A1 | 3/2004 |
| 2008/0251793 | A1 | 10/2008 | Mazzola | WO | WO 2004/079789 A2 | 9/2004 |
| 2008/0277669 | A1 | 11/2008 | Okuno et al. | WO | WO 2005/020308 A1 | 3/2005 |
| 2008/0296587 | A1 | 12/2008 | Yamamoto et al. | WO | WO 2006/135031 A2 | 12/2006 |
| 2008/0296771 | A1 | 12/2008 | Das et al. | WO | WO 2007/040710 A1 | 4/2007 |
| 2009/0085064 | A1 | 4/2009 | Rueb et al. | | | |
| 2009/0121319 | A1 | 5/2009 | Zhang et al. | | | |
| 2009/0146154 | A1 | 6/2009 | Zhang et al. | | | |
| 2009/0212301 | A1 | 8/2009 | Zhang et al. | | | |
| 2009/0267200 | A1 | 10/2009 | Gutt et al. | | | |
| 2009/0272983 | A1 | 11/2009 | Kumar et al. | | | |
| 2009/0289262 | A1 | 11/2009 | Zhang et al. | | | |
| 2010/0032685 | A1 | 2/2010 | Zhang et al. | | | |
| 2010/0133549 | A1 | 6/2010 | Zhang et al. | | | |
| 2010/0133550 | A1 | 6/2010 | Zhang et al. | | | |
| 2010/0140628 | A1 | 6/2010 | Zhang | | | |
| 2010/0244047 | A1 | 9/2010 | Hull et al. | | | |

FOREIGN PATENT DOCUMENTS

| | | |
|---|---|---|
| DE | 198 09 554 | 9/1998 |
| DE | 198 32 329 A1 | 2/1999 |
| DE | 19900171 | 7/1999 |
| DE | 10036208 A1 | 2/2002 |
| EP | 0 176 778 A2 | 4/1986 |
| EP | 0 372 412 A1 | 6/1990 |
| EP | 0 389 863 A1 | 10/1990 |
| EP | 0 615 292 A1 | 9/1994 |
| EP | 0637069 A1 | 2/1995 |
| EP | 0735591 A1 | 10/1996 |
| EP | 0837508 A2 | 4/1998 |
| EP | 0 865 085 A1 | 9/1998 |
| EP | 1 058 317 A2 | 12/2000 |
| EP | 1 361 614 A1 | 11/2003 |

OTHER PUBLICATIONS

A.K. Agarwal, J.B. Casady, L.B. Rowland, W.F. Valek, and C.D. Brandt, "1400 V 4H-SiC Power MOSFET's," *Materials Science Forum* vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters,* vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum,* vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device Letters,* vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.

Ayalew, T, "Dissertation of Tesfaye Ayalew", Section 4.4.3.1 MPS Diode Structure, *SiC Semiconductor Devices Technology, Modeling, and Simulation*, 2006.

Baliga "Insulated Gate Biopolar Transistor" *Power Semiconductor Devices*. PWS Publishing Company, Boston, MA. 426-502 (1996).

Baliga "Power MOSFET" *Power Semiconductor Devices*. PWS Publishing Company, Boston, MA 335-425 (1996).

Baliga, Power Semiconductor Devices, Chapter 7, PWS Publishing, 1996.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

Chakraborty et al. "Interface Properties of $N_2O$-annealed $SiO_2$/SiC system," *Proceedings IEEE Hong Kong Electron Devices Meeting*. Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc*. vol. 640, 2001.

Chen et al. "Theoretical Analysis of Current Crowding Effect in Metal/AlGaN/GaN Schottky Diodes and Its Reduction by Using Polysilicon in Anode,"Chin. Phys. Lett., vol. 24, No. 7 (2007) pp. 2112-2114.

Chinese Office Action dated Jan. 22, 2010, corresponding to Chinese Patent Application No. 200780029460.5, 7 pages.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217 (Aug. 21, 2000).

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Chung et al., "The Effect of Si:C Source Ratio on SiO2/SiC Interface State Density for Nitrogen Doped 4H and 6H-SiC," Materials Science Forum. (2000) vols. 338-342, pp. 1097-1100.

International Search Report and Written Opinion for corresponding International Application No. PCT/US2004/004982, dated Jul. 22, 2004.

International Search Report for PCT/US01/42414, dated Apr. 23, 2002.

International Search Report for PCT/US02/11691 dated Dec. 4, 2002.

D. Alok, E. Arnold, and R. Egloff, "Process Dependence of Inversion Layer Mobility in 4H-SiC Devices," *Materials Science Forum*, vols. 338-342, pp. 1077-1080, 2000.

Dahlquist et al. "A 2.8kV, Forward Drop JBS Diode with Low Leakage," *Materials Science Forum*, vols. 338-342, (2000) pp. 1179-1182.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

De Meo et al., "Thermal Oxidation of SiC in $N_2O$", *J. Electrochem. Soc.*, vol. 141, 1994, pp. L150-L152.

del Prado et al. "Full Composition Range Silicon Oxynitride Films Deposited by ECR-PECVD at Room Temperatures," *Thin Solid Films*. vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

European Search Report for corresponding EP patent application No. 09177558.5 dated Feb. 22, 2010.

European Search Report for corresponding EP patent application No. 09163424.6 dated Apr. 9, 2010.

European Search Report; Application No. EP07120038; Jun. 16, 2008.

Extended European Search Report (12 pages) corresponding to European Application No. 07112298; Dated Feb. 18, 2009.

Fisher, C.A. et al., "The performance of high-voltage field relieved Schottky barrier diodes", IEE Proceedings, vol. 132:6, Pt. I, pp. 257-260 (Dec. 1985).

Fukuda et al. "Improvement of $SiO_2$/4H-SiC Interface Using High-Temperature Hydrogen Annealing at Low Pressure and Vacuum Annealing," *Jpn J. Appl. Phys*. vol. 38, Apr. 1999, pp. 2306-2309.

Fukuda et al. "Improvement of $SiO_2$/4H-SiC Interface by Using High Temperature Hydrogen Annealing at 1000° C," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.

http://www.elec.gla.ac.uk; *The Insulated Gate Bipolar Transistor (IGBT)*; Feb. 14, 2007.

Hubel, K, "Hybrid design improves diode robustness and boosts efficiency," Compoundsemiconductor.net, 2006.

Hull et al., "Drift-Free 10-kV, 20-A 4H-SiC PiN Diodes," Journal of Electronic Materials, vol. 34, No. 4, 2005, pp. 341-344.

International Preliminary Report on Patentability (9 pages) corresponding to International Application No. PCT/US2007/010192; Mailing Date: Sep. 23, 2008.

International Search Report and Written Opinion (13 pages) corresponding to International Application No. PCT/US2008/010538; Mailing Date: Dec. 22, 2008.

International Search Report and Written Opinion (14 pages) corresponding to International Application No. PCT/US2010/020071; Mailing Date: Mar. 26, 2010.

International Search Report and Written Opinion (14 pages) corresponding to International Application No. PCT/US2009/065251; Mailing Date: Jun. 1, 2010.

International Search Report and Written Opinion (16 pages) corresponding to International Application No. PCT/US2009/003089; Mailing Date: Aug. 20, 2009.

International Search Report and Written Opinion for PCT/US2007/014139; Feb. 4, 2008.

International Search Report and Written Opinion for PCT/US2010/025053 mailed on Jul. 2, 2010.

International Search Report and Written Opinion, International Application No. PCT/US2009/000734, Apr. 23, 2009.

International Search Report, PCT/US2008/008574, Sep. 26, 2008.

Invitation to Pay Additional Fees for PCT/US2007/010192; Oct. 29, 2007.

Invitation to Pay Additional Fees for PCT/US2010/025053 mailed on May 3, 2010.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

Jamet, et al. "Physical properties of $N_2O$ and NO-nitrided gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16. No. 7, Jul. 1995, pp. 331-332.

Kobayashi et al. "Dielectric Breakdown and Current Conduction of Oxide/Nitride/Oxide Multi-Layer Structures," *1990 IEEE Symposium on VLSI Technology*. pp. 119-120.

Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.

L.A. Lipkin and J.W. Palmour, "Low interface state density oxides on p-type SiC," Materials Science Forum vols. 264-268, pp. 853-856, 1998.

Lai et al., "Interface Properties of $N_2O$-Annealed $NH_3$-Treated 6H-SiC MOS Capacitor," *Proc. 1999 IEEE Hong Kong Electron Devices Meeting*, Jun. 26, 1999, pp. 46-49.

Leonhard at al. "Long term stability of gate-oxides on n- and p-type silicon carbide studied by charge injection techniques," *Materials Science Engineering*, vol. 46, No. 1-3, Apr. 1997, pp. 263-266.

Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.

Lipkin et al. "Insulator Investigation on SiC for Improved Reliability," *IEEE Transactions on Electron Devices*. vol. 46, No. 3, Mar. 1999, pp. 525-32.

Lipkin et al. "Challenges and State-of-the-Art Oxides in SiC," *Mat. Res. Soc. Symp. Proc.* vol. 640, 2001, pp. 27-29.

Losee et al., "High-Voltage 4H-SiC PiN Rectifiers with Single-Implant, Multi-Zone JTE Termination", Power Semiconductor Devices and ICs, 2004 Proceedings. ISPSB '04. The 16$^{th}$ International Symposium on Kitakyushu Int. Conf. Center, Japan May 24-27, 2004, Piscataway, NJ, USA, IEEE, May 24, 2004, pp. 301-304, XP010723398.

M. Das et al., "A 13 kV 4H-SiC N-Channel IGBT with Low Rdiff, on and Fast Switching" presented at: International Conference on Silicon Carbide and Related Materials )ICSCRM), Otsu, Japan, Oct. 14-19, 2007.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

Myer-Ward et al. "Turning of Basal Plane Dislocations During Epitaxial Growth on 4 off-axis 4h-SiC" 7$^{th}$ *European Conference on Silicon Carbide and Related Materials*, Barcelona-Spain, Sep. 7-11, 2008 retrieved from http://ecscrm08.com/invited_presentations.html, retrieved Jul. 1, 2009.

Notification of Transmittal of the International Search Report and the Written Opinion of the International Searching Authority, or the Declaration, International Search Report, Written Opinion of the International Searching Authority, PCT/US2010/026632, Date of Mailing: Oct. 8, 2010, 16 pages.

Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.

Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.

Notification of Transmittal of the International Search Report and the Written Opinion of the International Searching Authority, or the Declaration, PCT/US2010/028612, Jun. 17, 2010.

Notification of Transmittal of the International Search Report and the Written Opinion of the International Searching Authority, or the Declaration; International Search Report; Written Opinion of the International Searching Authority, PCT/US2008/004239, Mar. 2, 2009.

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

Palmour et al. "SiC Device Technology: Remaining Issues," Diamond and Related Materials. vol. 6, 1997, pp. 1400-1404.

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page= retrieved on Feb. 10, 2010.

Panknin et al., "Electrical and microstructural properties of highly boron-implantation doped 6H-SiC", Journal of Applied Physics 89:6, pp. 3162-3167 (Mar. 15, 2001).

Pantelides et al., "Atomic-Scale Engineering of the SiC-SiO2 Interface," *Materials Science Forum*. (2000) vols. 338-342, pp. 1133-1136.

Patel, R., et al., Phosphorus-Implanted High-Voltage N.sup.+ P 4H-SiC Junction Rectifiers, Proceedings of 1998 International Symposium on Poer Semiconductor Devices & ICs, pp. 387-390 (Kyoto).

Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.

R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al. "Al and N Ion Implantations in 6H-SiC," Silicon Carbide and Related Materials. 1995 Conf, Kyoto, Japan. Published 1996.

Rao et al. "P-N Junction Formation in 6H-SiC by Acceptor Implantation into N-Type Substrate," Nuclear Instruments and Methods in Physics Research B. vol. 106, 1995, pp. 333-338.

Rao et al. "Silane overpressure post-implant annealing of Al dopants in SiC: Cold wall CVD apparatus" *Applied Surface Science* 252: 3837-3842 (2006).

Rao, "Maturing ion-implantation technology and its device applications in SiC", *Solid State Electronics* 47:2, pp. 213-222, Elsevier Science Publishers (Feb. 2003).

Ryu et al. Article and Presentation: "27 mΩ-cm², 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.M. Sze Semiconductor Devices, Physics and Technology. 2$^{nd}$ Edition, © 2002 John Wiley and Sons, p. 130.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Senzaki et al.; *Effects of Pyrogenic Reoxidation Annealing on Inversion Channel Mobility of 4H-SiC Metal-Oxide-Semiconductor Field-Effect Transistor Fabricated on (1120) Face;* Japanese Journal of Applied Physics, Japan Society of Applied Physics, Tokyo, JP; vol. 40, No. 11 B, Part 2; Nov. 2001; pp. L1201-L1203.

Singh, R. and J.W. Palmour, "Planer Terminations in 4H-SiC Schottky Diodes with Low Leakage and High Yields, "IEEE International Symposium on Power Semiconductor Devices and ICs, 1997, pp. 157-160.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Streetman "Bipolar Junction Transistors" *Solid State Electronic Devices*. Prentice Hall, Englewood Cliffs, NJ. 228-284 (1980).

Sugawara et al., "3.6 kV 4H-SiC JBS Diodes with Low RonS". Materials Science Forum, vols. 338-342:2, pp. 1183-1186 (2000). XP-000944901.

Sundaresan et al., "Ultra-low resistivity Al+ implanted 4H-SiC obtained by microwave annealing and a protective graphite cap", *Solid-State Electronics* vol. 52, 2008, pp. 140-145, XP022360431.

Suzuki et al. "Effect of Post-oxidation-annealing in Hydrogen on $SiO_2$/4H-SiC Interface," *Materials Science Forum*, vols. 338-342 (2000) 1073-6.

Sze, S.M. *Physics of Semiconductor Devices*, John Wiley & Sons, p. 383-390, 1981.

Thomas et al., "Annealing of Ion Implantation Damage in SiC Using a Graphite Mask", Material Research Society Symposium Y Proceedings vol. 572, Spring 1999, pp. 45-50.

Treu et al. "A Surge Current Stable and Avalanche Rugged SiC Merged pn Schottky Diode Blocking 600V Especially Suited for PFC Applications" *Materials Science Forum* vols. 527-529: 1155-1158 (2006).

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

V.V. Afanasev, M. Bassler, G. Pensl, and M. Schulz, "Intrinsic SiC/$SiO_2$ Interface States," *Phy. Stat. Sol. (a)*, vol. 162, pp. 321-337, 1997.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Vassilevski et al., "Protection of selectively implanted and patterned silicon carbide surfaces with graphite capping layer during post-implantation annealing, "Institute of Physics Publishing, Semicond. Sci. Technol. 20 (2005) 271-278.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Williams et al. "Passivation of the 4H-SiC/$SiO_2$ Interface with Nitric Oxide," *Materials Science Forum*. vols. 389-393 (2002), pp. 967-972.

Xu et al. "Improved Performance and Reliability of $N_2O$-Grown Oxynitride on 6H-SiH," *IEEE Electron Device Letters*. vol. 21, No. 6, Jun. 2000, p. 298-300.

Y. Li et al., "High Voltage (3 kV) UMOSFETs in 4H-SiC," *Transactions on Electron Devices*, vol. 49, No. 6, Jun. 2002.

Zhang et al.; *Design and Fabrications of High Voltage IGBTs on 4H-SiC;* 2006 IEEE Proceedings of the $18_{th}$ International Symposium on Power Semiconductor Devices & ICs, Napels, Italy Jun. 4-8, 2006, pp. 1-4.

Yilmaz, "Optimization and Surface Charge Sensitivity of High Voltage Blocking Structures with Shallow Junctions, "IEEE Transactions on Electron Devices, vol. 38, No. 3, Jul. 1991, pp. 1666-1675.

International Search Report and the Written Opinion of the International Searching Authority corresponding to Application No. PCT/US2011/027383; Date of Mailing: May 20, 2011; 8 Pages.

International Search Report and the Written Opinion of the International Searching Authority corresponding to International Application No. PCT/US2011/031150; Date of Mailing: Jun. 20, 2011; 10 Pages.

Japanese Office Action, JP Application No. 2007-199468, Mailing Date: Aug. 9, 2011, 9 pages (including translation).

Communication pursuant to Article 94(3)EPC, EP 07 112 298.0, Jan. 16, 2012.

International Preliminary Report of Patentability, PCT/US2010/035709, Dec. 15, 2011.

International Preliminary Report of Patentability, PCT/US2010/035713, Dec. 15, 2011.

Extended European Search Report, European Patent Application No. 11187310.5, Apr. 24, 2012, 12 pages.

International Search Report and Written Opinion of the International Searching Authority corresponding to International Application No. PCT/US2010/035709; Apr. 7, 2011, 12 pages.

European Communication Corresponding to Application No. 07 112 298.0; Dated: Jan. 16, 2012; 7 pages.

International Preliminary Report on Patentability Corresponding to International Application No. PCT/US2010/034502; Date of Mailing: Jan. 26, 2012; 12 pages.

Ryu et al. "10 kV, 123 mΩ-cm<2>4H-SiC Power DMOSFETs" *Device Research Conference, 2004. 62$^{nd}$ DRC. Conference Digest*, Jun. 21-23, 2004, Piscataway, NJ, USA, IEEE, Jun. 21, 2004, pp. 47-48. XP010748127.

Tang et al. "High-Voltage Implanted-Emitter 4H-SiC BJTS" IEEE *Electron Device Letters*, IEEE Service Center, New York, NY. vol. 23 No. 1. Jan. 1, 2002. XP001112376.

Tang et al. "Hybrid All-Sic MOS-Gated Bipolar Transistor (MGT)" *Proceedings of the 14$^{th}$ International Symposium on Power Semiconductor Devices & ICS. ISPSD'02*. Santa Fe, NM Jun. 4-7, 2002; International Symposium on Power Semiconductor Devices & IC's, New York, NY: IEEE, Jun. 4, 2002, pp. 53-56. XP010591564.

Decision of Rejection, Japanese Patent Application No. 2007-199468, Jul. 4, 2012, 5 pages.

* cited by examiner

SEMICONDUCTOR DEVICES INCLUDING SCHOTTKY DIODES HAVING DOPED REGIONS ARRANGED AS ISLANDS AND METHODS OF FABRICATING SAME

CROSS-REFERENCE TO RELATED APPLICATION

This application is a continuation of application Ser. No. 11/496,842, filed Aug. 1, 2006, now U.S. Pat. No. 7,728,402 entitled Semiconductor Devices Including Schottky Diodes With Controlled Breakdown And Methods Of Fabricating Same, assigned to the assignee of the present application, the disclosure of which is hereby incorporated herein by reference in its entirety as if set forth fully herein.

FIELD OF THE INVENTION

The present invention relates to semiconductor devices and the fabrication of semiconductor devices and more particularly, to Junction Barrier Schottky (JBS) diodes, and the fabrication of such diodes.

BACKGROUND

High voltage silicon carbide (SiC) Schottky diodes, which may have voltage blocking ratings between, for example, about 600V and about 2.5 kV, are expected to compete with silicon PIN diodes having similar voltage ratings. Such diodes may handle as much as about 100 amps or more of forward current, depending on their active area design. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based Schottky devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n– epitaxial layer, which functions as a drift region, is formed. The device typically includes a Schottky contact formed directly on the n– layer. A junction termination region, such as a guard ring and/or p-type JTE (junction termination extension) region, is typically formed to surround the Schottky junction active region. The purpose of junction termination region is to reduce or prevent electric field crowding at the edges of the Schottky junction, and to reduce or prevent the depletion region from interacting with the surface of the device. Surface effects may cause the depletion region to spread unevenly, which may adversely affect the breakdown voltage of the device. Other termination techniques include field plates and floating field rings that may be more strongly influenced by surface effects. A channel stop region may also be formed by implantation of n-type dopants in order to prevent the depletion region from extending to the edge of the device.

Regardless of the type of termination used, the Schottky diode will fail if a large enough reverse voltage is applied to the junction. Such failures are generally catastrophic, and may damage or destroy the device. Furthermore, even before the junction has failed, a Schottky diode may experience large reverse leakage currents. In order to reduce such leakage currents, the junction barrier Schottky (JBS) diode was developed. JBS diodes are sometimes referred to as Merged PIN-Schottky (MPS) diodes. A conventional JBS diode 10 is illustrated in FIG. 1. As shown therein, a conventional JBS diode includes an n-type substrate 12 on which an n– drift layer 14 is formed. A plurality of p+ regions 16 are formed, typically by ion implantation, in the surface of the n– drift layer 14. A metal anode contact 18 is formed on the surface of the n– drift layer 14 in contact with both the n– drift layer 14 and the p+ regions 16. The anode contact 18 forms a Schottky junction with the exposed portions of the drift layer 14, and may form an ohmic contact with the p+ regions 16. A cathode contact 20 is formed on the substrate 12. Silicon carbide-based JBS diodes are described, for example, in U.S. Pat. Nos. 6,104,043 and 6,524,900.

In forward operation, the junction J1 between the anode contact 18 and the drift layer 14 turns on before the junction J2 between the p+ regions 16 and the drift layer 14. Thus, at low forward voltages, the device exhibits Schottky diode behavior. That is, current transport in the device is dominated by majority carriers (electrons) injected across the Schottky junction J1 at low forward voltages. As there may be no minority carrier injection (and thus no minority charge storage) in the device at normal operating voltages, JBS diodes have fast switching speeds characteristic of Schottky diodes.

Under reverse bias conditions, however, the depletion regions formed by the PN junctions J2 between the p+ regions 16 and the drift layer 14 expand to block reverse current through the device 10, protecting the Schottky junction J1 and limiting reverse leakage current in the device 10. Thus, in reverse bias, the JBS diode 10 behaves like a PIN diode. The voltage blocking ability of the device 10 is typically determined by the thickness and doping of the drift layer 14 and the design of the edge termination.

One problem associated with silicon carbide based Schottky diodes under forward bias operation arises due to the nature of the Schottky junction J1. Namely, the Schottky junction of a silicon carbide based device may have a relatively high resistance compared, for example to a PIN junction. In some power switching applications, current surges (e.g., transient current spikes) may be experienced from time to time. In Schottky devices, such current surges may result in the dissipation of large amounts of power at the junction, which results in heating of the junction. Heating of the Schottky junction may lower the barrier of the junction, resulting in even more current flowing through the device. This phenomenon, known as thermal runaway, may damage or destroy the device.

Thermal runaway may also occur in devices under reverse bias conditions, as reverse leakage currents may increase with temperature as a result of thermal runaway. Furthermore, other problems may arise in reverse bias conditions. For example, as noted above, if the blocking voltage of the device is exceeded, the device may break down in an uncontrolled manner, which may damage or destroy the device.

SUMMARY

A semiconductor device according to some embodiments of the invention includes a semiconductor layer having a first conductivity type and having a surface in which an active region of the semiconductor device is defined, and a plurality of spaced apart first doped regions arranged within the active region. The plurality of first doped regions have a second conductivity type that is opposite the first conductivity type, and have a first dopant concentration. The plurality of first doped regions define a plurality of exposed portions of the semiconductor layer within the active region. The semiconductor device includes a second doped region in the semiconductor layer. The second doped region has the second conductivity type and has a second dopant concentration that is greater than the first dopant concentration. The semiconductor device further includes a metal layer on the surface of the semiconductor layer. The metal layer forms a Schottky junction with the defined exposed portions of the semiconductor layer and forms an ohmic contact with the second doped region.

The metal layer may include a first metal region in contact with the exposed portions of the semiconductor layer and the first doped region, and a second metal region in contact with the second doped region. The first metal region may include a metal different from the second metal region. The first metal region may include aluminum, titanium, and/or nickel, and the second metal region may include aluminum, titanium and/or nickel.

The semiconductor layer may include a silicon carbide semiconductor layer. The first doped region may include p-type silicon carbide having a dopant concentration of from about $1\times10^{17}$ to about $1\times10^{18}$ cm$^{-3}$, and the second doped region may include p-type silicon carbide having a dopant concentration of greater than about $5\times10^{18}$ cm$^{-3}$.

The semiconductor device may further include a plurality of second doped regions in the semiconductor layer. The plurality of first doped regions may be arranged as stripes and/or islands in the semiconductor layer.

The semiconductor layer may include an epitaxial layer of silicon carbide. The semiconductor device may further include a silicon carbide substrate having the first conductivity type, and the semiconductor layer may be on the substrate. The semiconductor device may further include an ohmic contact on the substrate.

The first conductivity type may be n-type and the second conductivity type may be p-type. In some embodiments, the first conductivity type may be p-type and the second conductivity type may be n-type.

The first doped region and the second doped region may be located at the surface of the semiconductor layer. A ratio of the surface area occupied by the first doped region and the second doped region to the total surface area of the active region of the diode may be about 0.3.

A turn-on voltage of a p-n junction between the second doped region and the semiconductor layer may be higher than a turn-on voltage of the Schottky junction between the metal layer and the exposed portions of the semiconductor layer.

The first doped region may have a dopant concentration and a thickness such that punch-through of a junction between the first doped region and the semiconductor layer occurs at a lower voltage than avalanche breakdown of the Schottky junction between the metal layer and the exposed portions of the semiconductor layer.

The semiconductor device may further include an edge termination region, and the first doped region may have a dopant concentration and thickness such that punch-through of a junction between the first doped region and the semiconductor layer occurs at a lower voltage than a breakdown voltage of the edge termination.

A semiconductor device according to further embodiments of the invention includes a semiconductor layer having a first conductivity type, a metal contact on the semiconductor layer and forming a Schottky junction with the semiconductor layer, and a semiconductor region in the semiconductor layer. The semiconductor region and the semiconductor layer form a first p-n junction in parallel with the Schottky junction. The first p-n junction is configured to generate a depletion region in the semiconductor layer adjacent the Schottky junction when the Schottky junction is reversed biased to limit reverse leakage current through the Schottky junction. The first p-n junction may be further configured such that punch-through of the first p-n junction occurs at a lower voltage than a breakdown voltage of the Schottky junction when the Schottky junction is reverse biased.

The semiconductor device may further include a second semiconductor region forming a second p-n junction in parallel with the Schottky junction and the first p-n junction. The second p-n junction may be configured to turn on at a higher forward voltage than the Schottky junction.

The first semiconductor region may have a first dopant concentration, and the second semiconductor region may have a second dopant concentration higher than the dopant concentration of the first semiconductor region.

The semiconductor layer may include a silicon carbide semiconductor layer. The first semiconductor region may include p-type silicon carbide having a dopant concentration of from about $1\times10^{17}$ to about $1\times10^{18}$ cm$^{-3}$, and the second semiconductor region may include p-type silicon carbide having a dopant concentration of greater than about $5\times10^{18}$ cm$^{-3}$.

The first semiconductor region may include a plurality of first doped regions in the semiconductor layer, and the second semiconductor region may include a plurality of second doped regions in the semiconductor layer. The plurality of first doped regions may be arranged as stripes and/or islands in the semiconductor layer.

Methods of forming a semiconductor device according to some embodiments of the invention include forming a first doped region in a semiconductor layer, and forming a metal layer on the semiconductor layer. The semiconductor layer has a first conductivity type and the first doped region has a second conductivity type opposite the first conductivity type, such that the semiconductor layer and the first doped region form a p-n junction. The metal layer forms a Schottky junction with the semiconductor layer and contacts the first doped region. The first doped region may have a thickness and dopant concentration such that punch-through of the p-n junction occurs at a lower voltage than an avalanche breakdown voltage of the Schottky junction between the metal layer and the semiconductor layer when the Schottky junction is reversed biased.

The methods may further include forming a second doped region in the semiconductor layer, the second doped region having a conductivity type opposite the conductivity type of the semiconductor layer and having a dopant concentration higher than the dopant concentration of the first doped region.

A junction between the second doped region and the semiconductor layer may be configured to turn on at a voltage that is higher than a turn-on voltage of the Schottky junction between the metal layer and the semiconductor layer.

Forming the metal layer may include forming a first metal layer on the second doped region. The first metal layer forms an ohmic contact with the second doped region. Forming the metal layer may further include forming a second metal layer on the semiconductor layer and the first doped region, the second metal layer forming the Schottky junction with the semiconductor layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
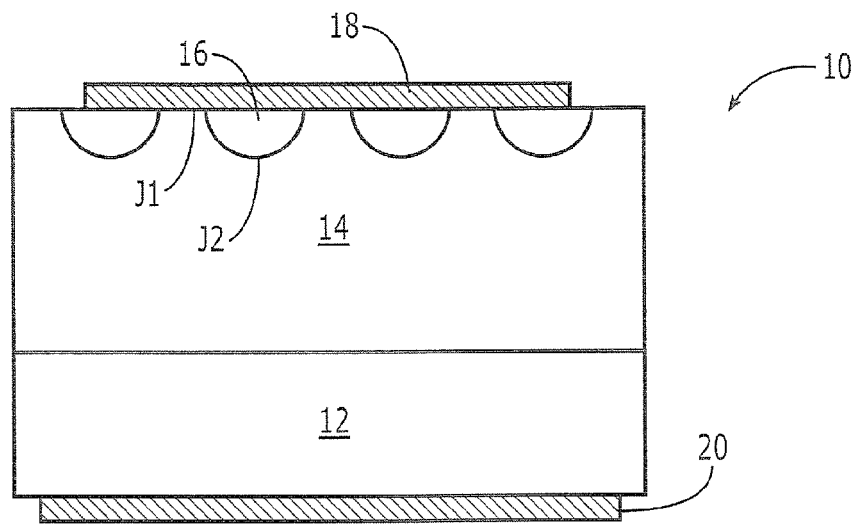
FIG. 1 is a cross-sectional view of a conventional JBS diode.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Figure 2:
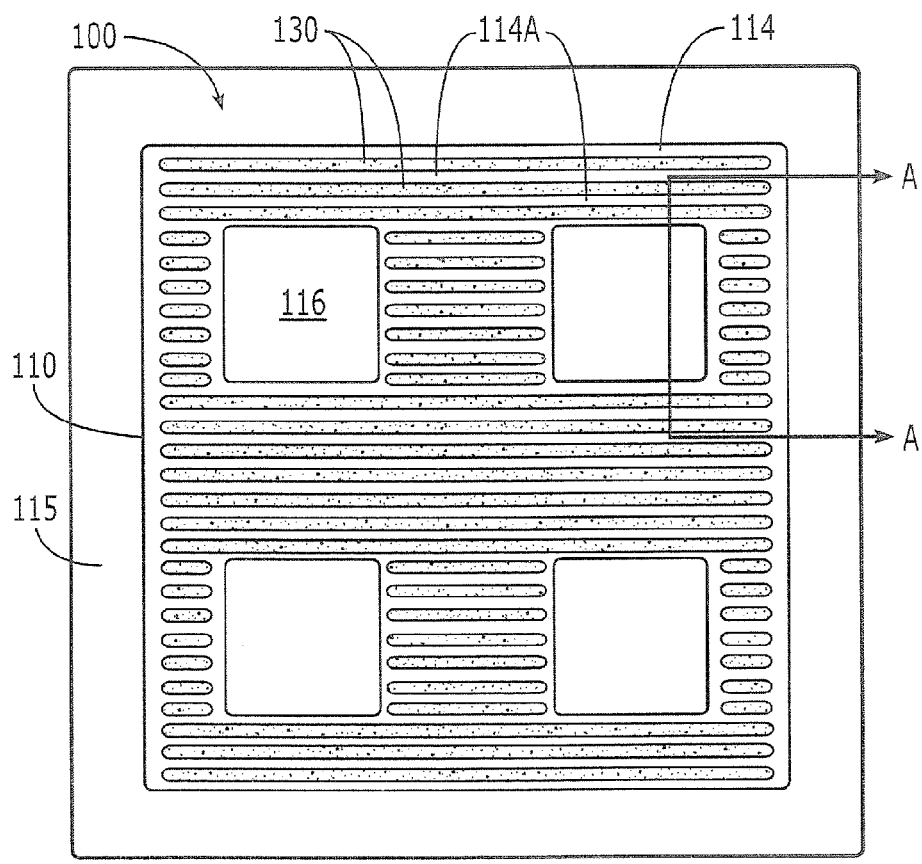
FIG. 2 is a top view of a JBS diode according to some embodiments of the present invention.

FIG. 2 is a top view of a diode 100 according to some embodiments of the invention. The diode 100 includes a drift layer 114 having an upper surface in which a plurality of lightly doped regions 130 of opposite conductivity type from the drift layer 114 are formed. In the embodiments of FIG. 2, the lightly doped regions 130 are formed as stripe-shaped regions in the drift layer 114. The lightly doped regions 130 may be formed in other shapes, however.

The drift layer 114 may be formed, for example, from n-type silicon carbide of the 2H, 4H, 6H, 3C and/or 15R polytype having a dopant concentration of about $2 \times 10^{14}$ to about $1 \times 10^{17}$ cm$^{-3}$, depending on design requirements for voltage blocking and on-resistance for the diode 100. Other types of semiconductor materials, such as GaN, GaAs, silicon or germanium may be used. In particular embodiments, the drift layer 114 includes 4H—SiC doped with n-type dopants at a concentration of about $5 \times 10^{15}$ cm$^{-3}$. The lightly doped regions 130 may be formed, for example, by ion implantation of p-type dopants such as boron and/or aluminum into the drift layer 114 at a concentration of about $1 \times 10^{17}$ to about $1 \times 10^{18}$ cm$^{-3}$, and may extend to a depth of about 0.3 to about 0.5 μm beneath the surface of the drift layer 114. In particular embodiments, the lightly doped regions 130 may be doped at a dopant concentration of about $5 \times 10^{17}$ cm$^{-3}$, and may extend to a depth of about 0.3 μm beneath the surface of the drift layer 114.

A plurality of heavily doped regions 116 are also provided in the drift layer 114. The heavily doped regions 116 may be formed, for example, by ion implantation of p-type dopants such as boron and/or aluminum into the drift layer 114 at a concentration of about $1 \times 10^{18}$ to about $1 \times 10^{19}$ cm$^{-3}$, and may extend to a depth of about 0.3 to about 0.5 μm beneath the surface of the drift layer 114. In particular embodiments, the heavily doped regions 116 may be doped at a dopant concentration of about $5 \times 10^{18}$ cm$^{-3}$, and may extend to a depth of about 0.3 μm beneath the surface of the drift layer 114. Regions 116 may be formed, for example, by epitaxial growth.

The lightly doped regions 130 shown in the embodiments of FIG. 2 are provided as spaced apart striped regions that expose portions 114A of the surface of the drift layer 114 and that extend across an active region 110 of the drift layer 114 (except for the exposed portions 114A of the drift layer and the heavily doped regions 116). A metal Schottky contact (not shown) covers the drift layer 114 and is in contact with the exposed portions 114A of the drift layer 114 as well as the lightly doped regions 130 and the heavily doped regions 116. As used herein, the term "active region" refers to the two dimensional area of the device in which the Schottky metal contacts the drift layer and includes the exposed portions 114A of the drift layer 114, the lightly doped regions 130 and the heavily doped regions 116. Accordingly, the active region includes the Schottky junction area but does not include, for example, the edge termination region described below.

The diode 100 may include an edge termination region 115 surrounding the active region 110 of the diode 100. The edge termination region 115 may include a junction termination extension (JTE) region, field rings, field plates, guard rings, and/or a combination of the foregoing or other terminations.

Additional conventional terminations of SiC Schottky diodes are described in "Planar Terminations in 4H—SiC Schottky Diodes With Low Leakage And High Yields" by Singh et al., ISPSD '97, pp. 157 160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331 332. Additionally, other termination techniques are described in published PCT Application No. WO 97/08754 entitled "SiC Semiconductor Device Comprising A PN Junction With A Voltage Absorbing Edge."

Another type of junction termination is disclosed in U.S. Pat. No. 7,026,650, which is assigned to the assignee of the present invention, the disclosure of which is incorporated herein by reference as if set forth fully.

Figure 3:
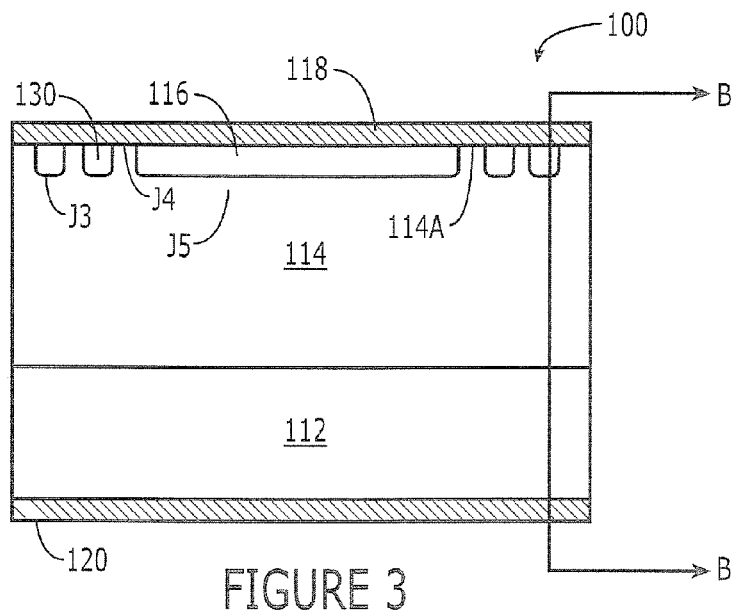
FIG. 3 is a cross-sectional view of a JBS diode according to some embodiments of the present invention.

FIG. 3 is a cross section illustration of the diode 100 taken generally along lines A-A of FIG. 2. The dimensions of some features of the diode 100 are exaggerated for clarity. As seen in FIG. 3, the diode 100 includes a substrate 112 on which the drift layer 114 is formed. The heavily doped regions 116 may be formed as an implanted region within the drift layer 114. Similarly, the lightly doped regions 130 may be formed as implanted regions in the drift layer 114. As the heavily doped regions 116 and the lightly doped regions 130 have an opposite conductivity type from the drift layer 114, the lightly doped regions 130 form a p-n junction J3 with the drift layer 114, while the heavily doped regions 116 form a p-n junction J5 with the drift layer 114.

The ratio of the surface area of the active region 110 of the device 100 occupied by the lightly doped regions 130 and the heavily doped regions 116 to the total surface area of the active region 110 may affect both the reverse leakage current of the device 100 and the forward voltage drop of the device 100. For example, if the area occupied by the lightly doped regions 130 and the heavily doped regions 116 is increased relative to the total area of the active region 110, the reverse leakage current may be reduced, but the forward voltage drop of the device 100 may increase. Thus, the selection of the ratio of the surface area of the active region 110 of the device 100 occupied by the lightly doped regions 130 and the heavily doped regions 116 to the total surface area of the active region 110 may entail a trade-off between reverse leakage current and forward voltage drop. In some embodiments, the ratio of the surface area of the active region 110 of the device 100 occupied by the lightly doped regions 130 and the heavily doped regions 116 to the total surface area of the active region 110 may be between about 2% and 40%.

An anode contact 118 on the surface of the drift layer 114 forms a Schottky junction J4 with the exposed portions 114A of the drift layer 114 between adjacent lightly doped regions 130 and/or between a lightly doped region 130 and the heavily doped region 116. The anode contact 118 may include a metal, such as aluminum, titanium and/or nickel, that may form an ohmic contact with the heavily doped region 116, while forming a Schottky contact with the drift layer 114.

A cathode contact 120 is formed on a side of the substrate 112 opposite the drift layer 114. The cathode contact 120 may include a metal, such as nickel, that is capable of forming an ohmic contact to n-type silicon carbide.

In forward operation, the junction J4 between the anode contact 118 and the exposed portions 114A of the drift layer 114 turns on before the junction J5 between the heavily doped region 116 and the drift layer 114. Thus, at low forward voltages, the device exhibits Schottky diode behavior. That is, at low forward voltages, the operation of the diode 100 is dominated by the injection of majority carriers across the Schottky junction J4. Due to the absence of minority carrier injection under normal operating conditions, the diode 100 may have a very fast switching capability, which is characteristic of Schottky diodes in general.

The heavily doped region 116 may be designed to begin to conduct at a forward voltage that is higher than the turn-on voltage of the Schottky junction J4. Thus, in the event of a current surge that causes the forward voltage of the diode 100 to increase, the p-n junction J5 will begin to conduct. Once the p-n junction J5 begins to conduct, the operation of the diode 100 is dominated by the injection and recombination of minority carriers across the p-n junction J5. In that case, the on-resistance of the diode may decrease, which may decrease the amount of power dissipated by the diode 100 for a given level of current. Thus, turn-on of the p-n junction J5 when the forward voltage of the diode 100 increases may reduce and/or prevent forward current runaway in the diode 100.

Under reverse bias conditions, however, the depletion regions formed by the p-n junctions J3 between the lightly doped regions 130 and the drift layer 114, as well as the depletion region of the p-n junction J5, may expand to block reverse current through the device 100, protecting the Schottky junction J4 and limiting reverse leakage current in the device 100. Thus, in reverse bias, the diode 100 may function substantially like a PIN diode.

Unlike a conventional JBS Schottky diode, the voltage blocking ability of a diode 100 according to some embodiments of the invention is determined by the thickness and doping of the lightly doped regions 130. That is, when a sufficiently large reverse voltage is applied to the diode 100, the depletion regions in the lightly doped regions 130 will punch through to the depletion region associated with the anode contact 118, permitting a large reverse current to flow through the device 100. As the lightly doped regions 130 are distributed across the active region of the diode 100, this reverse breakdown may be uniformly distributed and controlled such that it may not damage the diode 100. That is, the breakdown of the device 100 may be localized to a punch-through of the lightly doped regions 130, which may result in a breakdown current that is distributed evenly across the active region 110 of the diode 100. As a result, the breakdown characteristics of the diode 100 may be controlled, and the diode 100 may be capable of sustaining large reverse currents without damaging and/or destroying the diode 100.

In some embodiments, the doping of the lightly doped regions 130 may be chosen such that the punch-through voltage is slightly less than the maximum reverse voltage that may otherwise be supported by the edge termination of the diode 100.

Figure 4A:
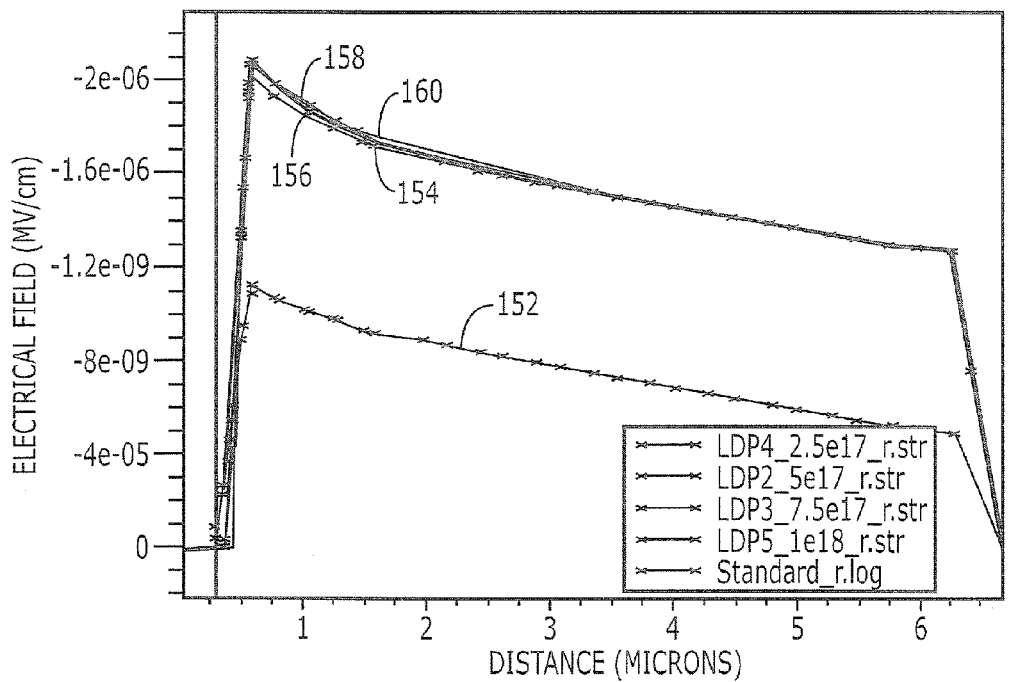
FIGS. 4A and 4B are graphs of electric field versus depth in a JBS diode according to some embodiments of the invention.

FIG. 4A is a graph of simulated vertical electric field distributions in devices according to some embodiments of the invention, for example, along line B-B of FIG. 3, for devices having varying levels of doping in the lightly doped regions 130, as well as for a conventional JBS Schottky diode device having no lightly doped regions 130. For the conventional JBS Schottky diode, the vertical field distribution through one of the p+ regions 16 and the drift layer 14 (FIG. 1) is shown. In particular, FIG. 4A illustrates vertical fields at breakdown voltages for four devices including lightly doped regions 130 having dopant concentrations of $2.5 \times 10^{17}$ cm$^{-3}$ (Curve 152), $5 \times 10^{17}$ cm$^{-3}$ (Curve 154), $7.5 \times 10^{17}$ cm$^{-3}$ (Curve 156) and $1 \times 10^{18}$ cm$^{-3}$ (Curve 158) as well as for one conventional JBS Schottky diode (Curve 160).

For the device having a dopant concentration of $2.5 \times 10^{17}$ cm$^{-3}$ in the lightly doped regions 130, the depletion region in the lightly doped region 130 has punched through to the Schottky contact 118, resulting in a lowering of the field in the device, as shown by curve 152. For the device with a dopant concentration of $1 \times 10^{18}$ cm$^{-3}$ in the lightly doped regions 130, the device behaves more like a conventional JBS Schottky diode, in that the depletion region does not extend far into the lightly doped regions 130. In the remaining devices, the depletion region in the lightly doped regions 130 begins to approach the depletion region beneath the Schottky contact 118. When the depletion region of the lightly doped region 130 contacts the depletion region associated with the Schottky contact 118, punch through begins to occur, which permits reverse current flow from the drift layer 114 to the Schottky contact 118 to increase rapidly with reverse voltage.

Figure 4B:
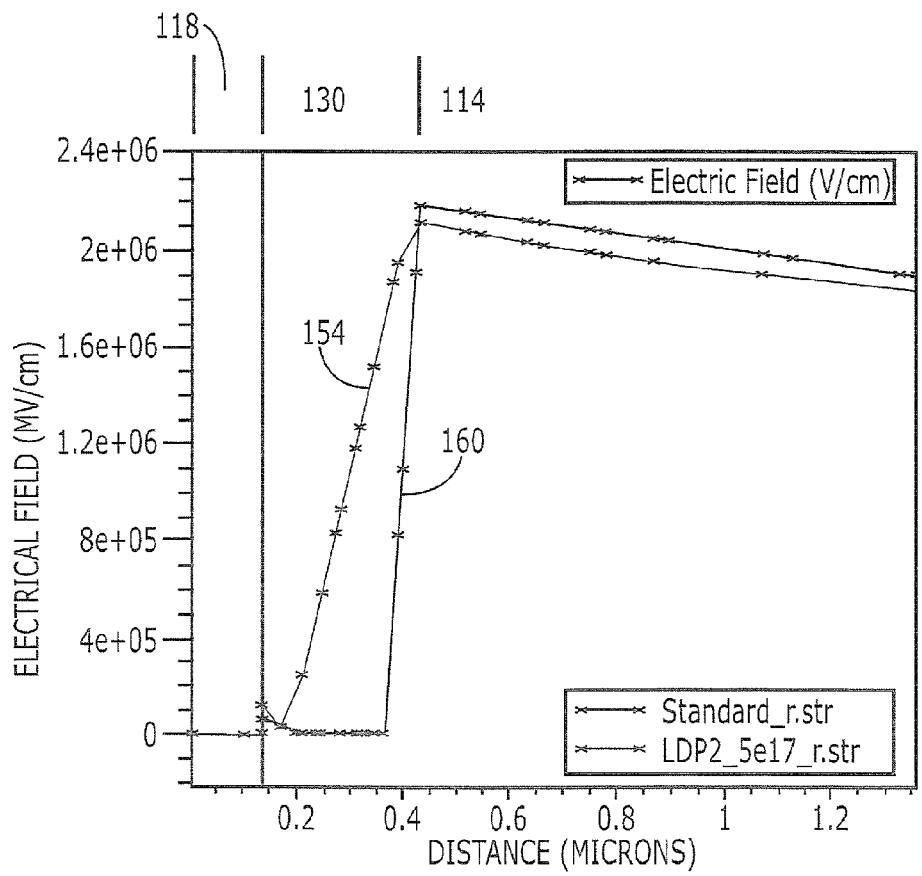

The shape of the depletion region in the lightly doped regions 130 is illustrated in greater detail in FIG. 4B, which is a rescaled graph of curves 154 and 160 of FIG. 4A. As seen in FIG. 4B, for the device having a dopant concentration in the lightly doped regions 130 of $5 \times 10^{17}$ cm$^{-3}$, the depletion region in the lightly doped region 130 associated with the p-n junction between the lightly doped region 130 and the drift layer 114 extends into the lightly doped region 130 to the point that it contacts the depletion region formed by the Schottky contact 118.

Figure 5A:
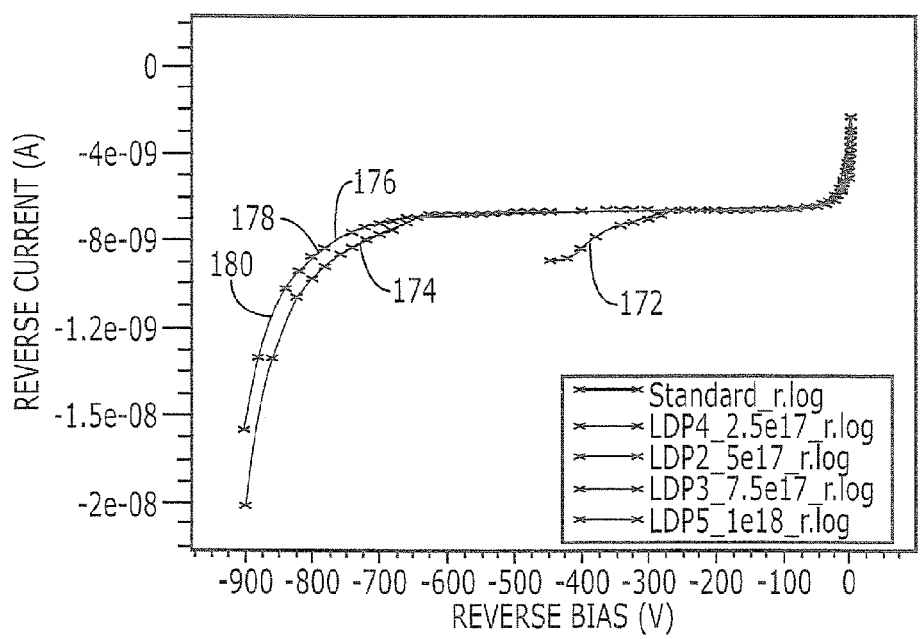
FIGS. 5A and 5B are graphs of reverse current versus reverse bias for JBS diodes according to some embodiments of the invention.

FIG. 5A is a graph of simulated reverse current versus reverse bias for 600V-rated JBS Schottky devices having varying levels of doping in the lightly doped regions 130, as well as for a device with no lightly doped regions. In particular, FIG. 5A illustrates reverse currents for four devices including lightly doped regions 130 having dopant concentrations in the lightly doped regions 130 of $2.5 \times 10^{17}$ cm$^{-3}$ (Curve 172), $5 \times 10^{17}$ cm$^{-3}$ (Curve 174), $7.5 \times 10^{17}$ cm$^{-3}$ (Curve 176) and $1 \times 10^{18}$ cm$^{-3}$ (Curve 178) as well as for one conventional JBS Schottky diode (Curve 180). The device having a dopant concentration of $2.5 \times 10^{17}$ cm$^{-3}$ in the lightly doped regions 130 (Curve 172) exhibits premature breakdown, while curves 178 and 180 are practically coincident, indicating that the device having a dopant concentration of $1 \times 10^{18}$ cm$^{-3}$ may not break down due to punch-through of the lightly doped regions 130.

Figure 5B:
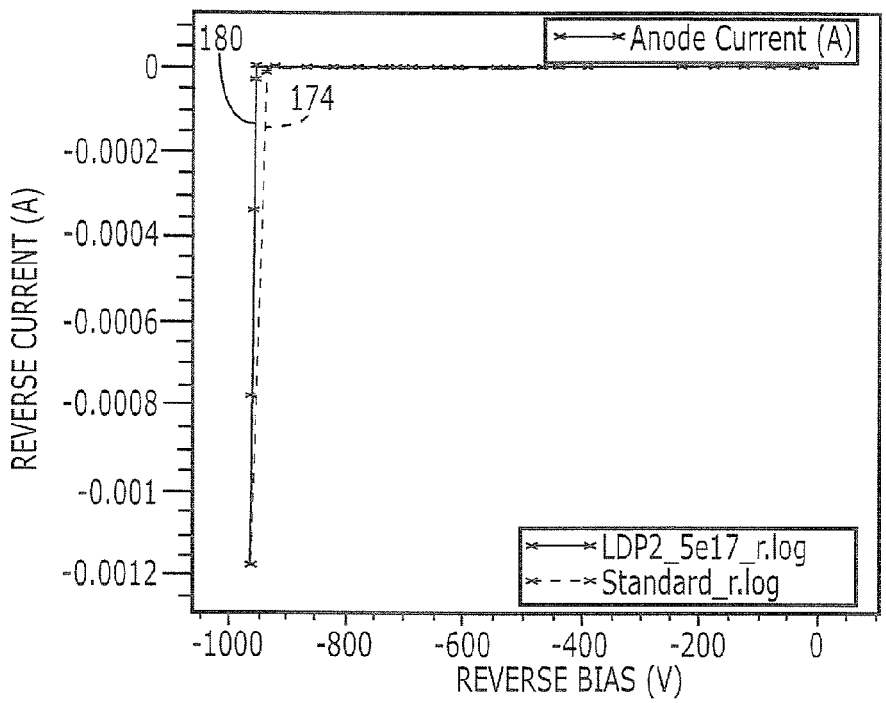

FIG. 5B is a rescaled graph of curves 174 and 180. As seen in FIG. 5B, a Schottky diode including lightly doped regions 130 having a doping concentration of $5 \times 10^{17}$ cm$^{-3}$ can exhibit similar breakdown behavior as a standards JBS Schottky diode, albeit with more uniform reverse current leakage distribution.

Figure 6:
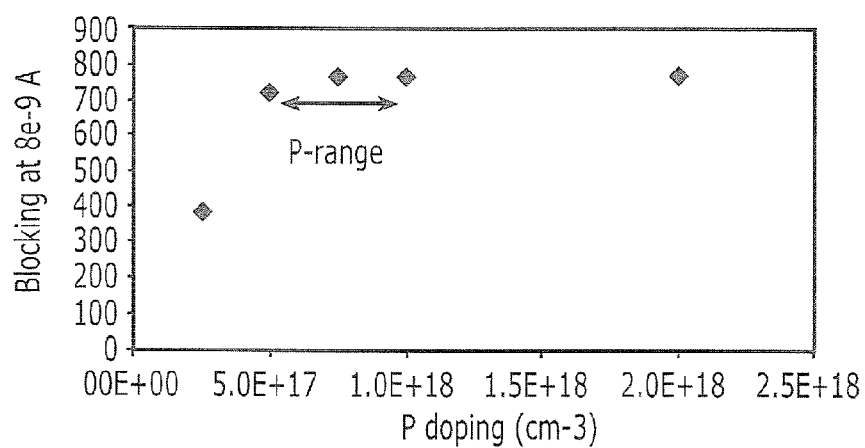
FIG. 6 is a graph of blocking voltage versus doping for JBS diodes according to some embodiments of the invention.

FIG. 6 is a plot of blocking voltage versus doping for JBS diodes according to some embodiments of the invention. As shown in FIG. 6, a dopant concentration for the lightly doped regions 130 as low as $5 \times 10^{17}$ cm$^{-3}$ may result in a diode having a desired blocking voltage. As the dopant concentration is increased beyond about $7.5 \times 10^{17}$ cm$^{-3}$, however, the blocking voltage does not increase substantially. However, as noted above, the breakdown mechanism may not be punch-through for devices with higher dopant concentrations in the lightly doped regions 130.

It will be appreciated by those skilled in the art that the doping concentrations and dimensions required to obtain a desired punch-thorough voltage in a device fabricated in accordance with the present invention may vary from the concentrations and/or dimensions described above due, for example, to differences in manufacturing techniques.

Figure 7:
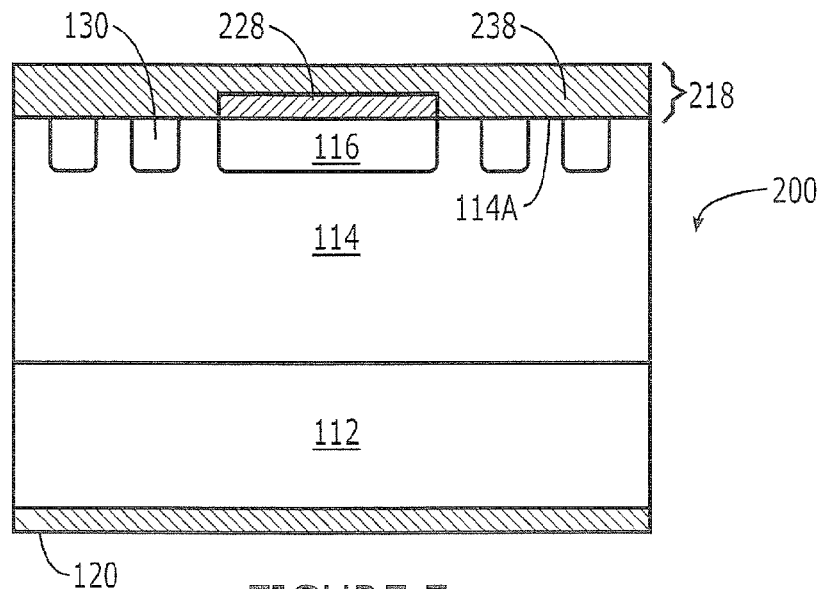
FIG. 7 is a cross-sectional view of a JBS diode according to further embodiments of the present invention.

A diode 200 according to further embodiments of the invention is illustrated in FIG. 7. The diode 200 includes a substrate 112 and a drift layer 114. A heavily doped region 116 is formed in the drift layer 114 along with a plurality of lightly doped regions 130. The diode 200 further includes an anode contact 218 that includes a first portion 228 that forms an ohmic contact on the heavily doped region 116 and a second portion 238 that forms a Schottky contact with the drift layer 114. As shown in FIG. 7, the second portion 238 may be formed to cover the first portion 228 of the anode contact 218. The first portion 228 may include, for example, aluminum, titanium and/or nickel, while the second portion 238 may include, for example, aluminum, titanium and/or nickel. Other suitable materials for forming ohmic and/or Schottky contacts to silicon carbide are known in the art and may be used in connection with some embodiments of the invention.

Figure 8:
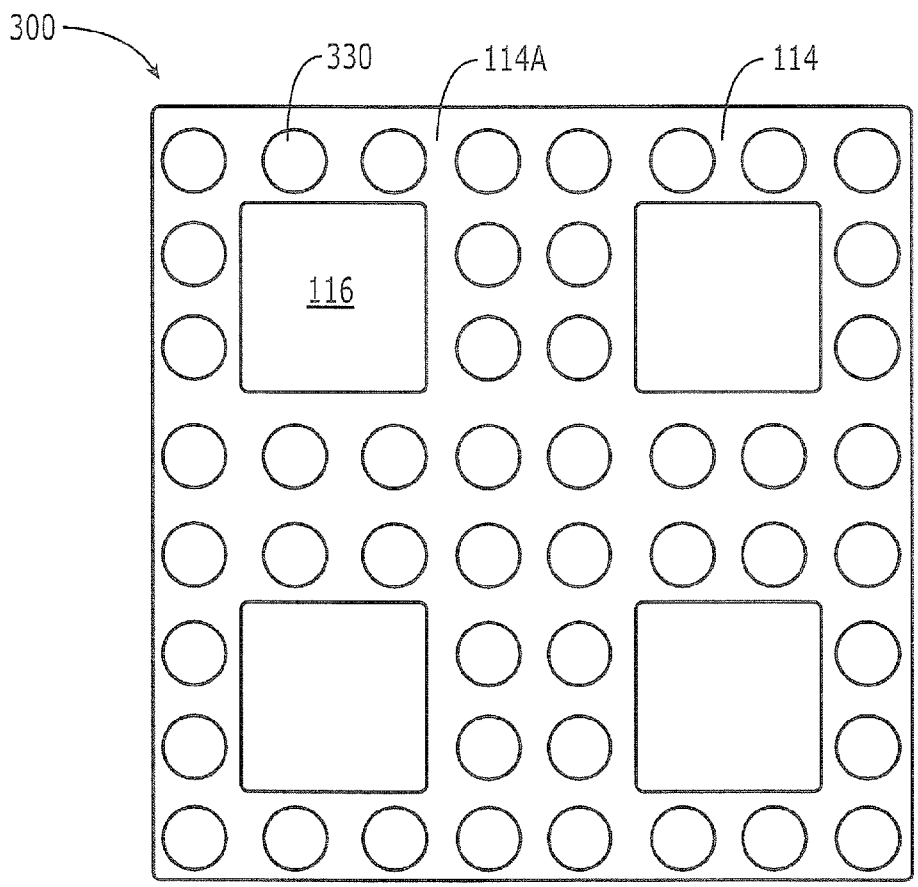
FIG. 8 is a top view of a JBS diode according to further embodiments of the present invention.

FIG. 8 illustrates a diode 300 according to further embodiments of the invention. As shown in FIG. 8, the diode 300 may include a plurality of lightly doped regions 330 that are arranged as circular islands 330 in the drift layer 114, as opposed to the stripe-shaped regions of the device 100 of FIG. 2. In some embodiments, the lightly doped regions 330 may have a shape that is generally rectangular and/or that is irregular.

Figure 9:
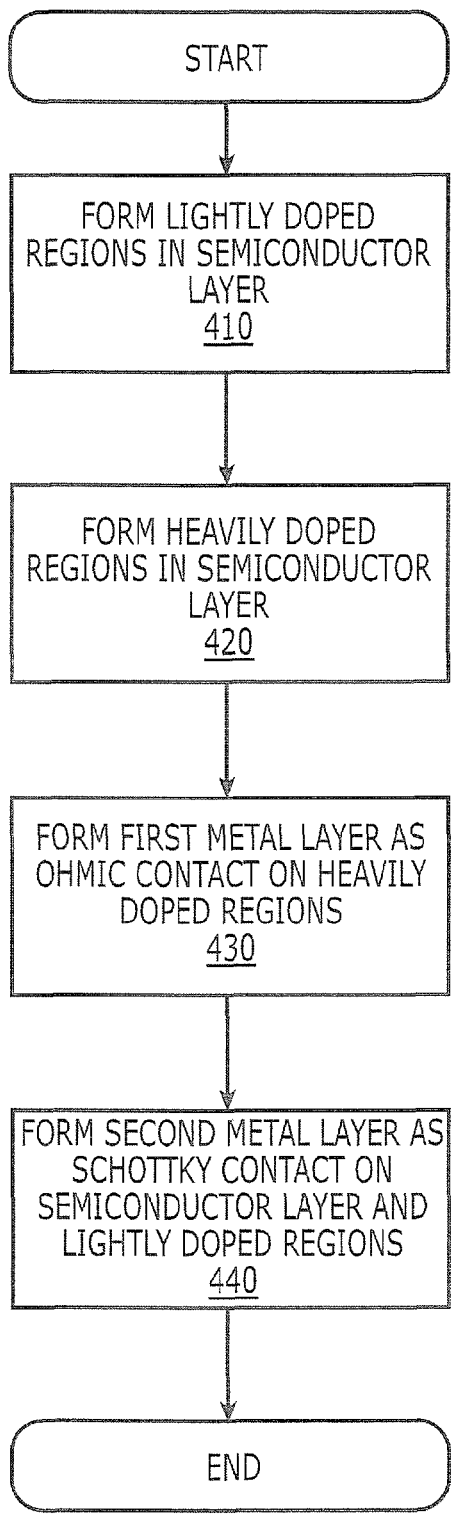
FIG. 9 is a flowchart illustrating operations according to some embodiments of the invention.

Methods according to some embodiments of the invention are illustrated in the flowchart of FIG. 9. As shown therein, the methods include forming lightly doped regions 130 in a semiconductor layer 114 (block 410). As noted above, the lightly doped regions 130 have a conductivity type opposite the conductivity type of the semiconductor layer 114.

The methods further include forming heavily doped regions 116 in the semiconductor layer 114 (block 420). The heavily doped regions 116 have the same conductivity type as the lightly doped regions 130, but are more heavily doped than the lightly doped regions 130. The lightly doped regions 130 and the heavily doped regions may be formed via ion implantation.

A first metal layer 228 is formed as an ohmic contact on the heavily doped regions 116 (block 430), and a second metal layer 238 is formed on the semiconductor layer 114 and the lightly doped regions 130 (block 440). The second metal layer 238 may form a Schottky contact with the exposed portions 114A of the semiconductor layer 114. The second metal layer 238 may also form a Schottky contact with the lightly doped regions 130.

While embodiments of the present invention have been described with reference to particular sequences of operations, as will be appreciated by those of skill in the art, certain operations within the sequence may be reordered while still benefiting from the teachings of the present invention. Accordingly, the present invention should not be construed as limited to the exact sequence of operations described herein.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device, comprising:
   a semiconductor layer having a first conductivity type and having a surface in which an active region of the semiconductor device is defined;
   a plurality of spaced apart first doped regions arranged within the active region, the plurality of first doped regions having a second conductivity type that is opposite the first conductivity type, having a first dopant concentration, and defining a plurality of exposed portions of the semiconductor layer within the active region, wherein the plurality of first doped regions are arranged as islands in the semiconductor layer; and
   a second doped region in the active region of the semiconductor layer and between and spaced apart from the plurality of spaced apart first doped regions, the second doped region having the second conductivity type and having a second dopant concentration that is greater than the first dopant concentration.

2. The semiconductor device of claim 1, wherein the islands comprise circular islands.

3. The semiconductor device of claim 1, wherein the islands have irregular shapes.

4. The semiconductor device of claim 1, wherein the islands have rectangular shapes.

5. The semiconductor device of claim 1, wherein the islands have polygonal shapes.

6. The semiconductor device of claim 1, wherein the semiconductor layer comprises an epitaxial layer of silicon carbide.

7. The semiconductor device of claim 1, wherein the plurality of first doped regions and the second doped region are located at the surface of the semiconductor layer, and wherein a ratio of a surface area occupied by the plurality of first doped regions and the second doped region to a total surface area of the active region of the diode is about 0.3.

8. The semiconductor device of claim 1, the device further comprising a metal layer on the surface of the semiconductor layer, the metal layer forming a Schottky junction with the defined exposed portions of the semiconductor layer and forming an ohmic contact with the second doped region,
   wherein a turn-on voltage of a p-n junction between the second doped region and the semiconductor layer is higher than a turn-on voltage of the Schottky junction between the metal layer and the exposed portions of the semiconductor layer.

9. The semiconductor device of claim 1, the device further comprising a metal layer on the surface of the semiconductor layer, the metal layer forming a Schottky junction with the defined exposed portions of the semiconductor layer and forming an ohmic contact with the second doped region,
   wherein the first doped regions have a thickness and dopant concentration such that punch-through of p-n junctions between the first doped regions and the semiconductor layer occurs at a lower voltage than breakdown of the Schottky junction between the metal layer and the exposed portions of the semiconductor layer.

10. A semiconductor device, comprising:
    a semiconductor layer having a first conductivity type and having a surface in which an active region of the semiconductor device is defined;
    a plurality of spaced apart first doped regions arranged within the active region, the plurality of first doped regions having a second conductivity type that is opposite the first conductivity type, having a first dopant concentration, and defining a plurality of exposed portions of the semiconductor layer within the active region, wherein the plurality of first doped regions are arranged as islands in the semiconductor layer;
    a second doped region in the active region of the semiconductor layer, the second doped region having the second conductivity type and having a second dopant concentration that is greater than the first dopant concentration; and
    a metal layer on the surface of the semiconductor layer, the metal layer forming a Schottky junction with the defined exposed portions of the semiconductor layer and forming an ohmic contact with the second doped region,
    wherein the metal layer comprises a first metal region in contact with the exposed portions of the semiconductor layer and the first doped region and a second metal region in contact with the second doped region, wherein the first metal region comprises a metal different from the second metal region.

11. The semiconductor device of claim 10, wherein the semiconductor layer comprises a silicon carbide semiconductor layer.

12. The semiconductor device of claim 11, wherein the first doped region comprises p-type silicon carbide having a dopant concentration of from about $1\times10^{17}$ to about $1\times10^{18}$ $cm^{-3}$, and the second doped region comprises p-type silicon carbide having a dopant concentration of greater than about $5\times10^{18}$ $cm^{-3}$.

13. A semiconductor device, comprising:
    a semiconductor layer having a first conductivity type and having a surface in which an active region of the semiconductor device is defined;
    a plurality of spaced apart first doped regions arranged within the active region, the plurality of first doped regions having a second conductivity type that is opposite the first conductivity type, having a first dopant concentration, and defining a plurality of exposed portions of the semiconductor layer within the active region, wherein the plurality of first doped regions are arranged as islands in the semiconductor layer;

a second doped region in the active region of the semiconductor layer and spaced apart from the plurality of spaced apart first doped regions, the second doped region having the second conductivity type and having a second dopant concentration that is greater than the first dopant concentration; and an edge termination region, wherein the first doped regions have a thickness and dopant concentration such that punch-through of p-n junctions between the first doped regions and the semiconductor layer occurs at a lower voltage than a breakdown voltage of the edge termination region.

14. A semiconductor device comprising:

a semiconductor layer having a first conductivity type;

a metal contact on the semiconductor layer and forming a Schottky junction with the semiconductor layer;

a semiconductor region in the semiconductor layer and having a second conductivity type, opposite the first conductivity type, and comprising a plurality of first doped regions arranged as islands in the semiconductor layer;

wherein the first doped regions and the semiconductor layer form respective p-n junctions in parallel with the Schottky junction;

wherein the p-n junctions are configured to generate a depletion region in the semiconductor layer adjacent the Schottky junction when the Schottky junction is reversed biased to limit reverse leakage current through the Schottky junction; and wherein the p-n junctions are further configured such that punch-through of the p-n junctions occurs at a lower voltage than a breakdown voltage of the Schottky junction.

15. The semiconductor device of claim 14, wherein the plurality of first doped regions and a second doped region are located at the surface of the semiconductor layer, and wherein a ratio of a surface area occupied by the plurality of first doped regions and the second doped region to a total surface area of the active region of the diode is between about 0.02 and 0.4.

16. The semiconductor device of claim 15, wherein the plurality of first doped regions and the second doped region are located at the surface of the semiconductor layer, and wherein a ratio of a surface area occupied by the plurality of first doped regions and the second doped region to a total surface area of the active region of the diode is about 0.3.

17. The semiconductor device of claim 14, wherein a turn-on voltage of a p-n junction between a second doped region and the semiconductor layer is higher than a turn-on voltage of the Schottky junction between the metal layer and the exposed portions of the semiconductor layer.

18. The semiconductor device of claim 14, wherein the metal layer comprises a first metal region in contact with the exposed portions of the semiconductor layer and the first doped region and a second metal region in contact with a second doped region, wherein the first metal region comprises a metal different from the second metal region.

19. The semiconductor device of claim 14, wherein the semiconductor layer comprises a silicon carbide semiconductor layer.

20. The semiconductor device of claim 14, wherein the first doped region comprises p-type silicon carbide having a dopant concentration of from about $1\times10^{17}$ to about $1\times10^{18}$ cm$^{-3}$, and a second doped region comprises p-type silicon carbide having a dopant concentration of greater than about $5\times10^{18}$ cm$^{-3}$.

* * * * *